United States Patent
Ragot et al.

(10) Patent No.: US 9,940,943 B2
(45) Date of Patent: Apr. 10, 2018

(54) RESAMPLING OF AN AUDIO SIGNAL INTERRUPTED WITH A VARIABLE SAMPLING FREQUENCY ACCORDING TO THE FRAME

(71) Applicant: Orange, Paris (FR)

(72) Inventors: Stephane Ragot, Lannion (FR); Jerome Daniel, Penvenan (FR); Balazs Kovesi, Lannion (FR)

(73) Assignee: ORANGE, Paris (FR)

( * ) Notice: Subject to any disclaimer, the term of this patent is extended or adjusted under 35 U.S.C. 154(b) by 0 days.

(21) Appl. No.: 15/106,684

(22) PCT Filed: Dec. 11, 2014

(86) PCT No.: PCT/FR2014/053285
§ 371 (c)(1),
(2) Date: Jun. 20, 2016

(87) PCT Pub. No.: WO2015/092229
PCT Pub. Date: Jun. 25, 2015

(65) Prior Publication Data
US 2016/0343384 A1  Nov. 24, 2016

(30) Foreign Application Priority Data

Dec. 20, 2013 (FR) ..................... 13 63322

(51) Int. Cl.
*G10L 19/24* (2013.01)
*H03H 17/06* (2006.01)
(Continued)

(52) U.S. Cl.
CPC ............ *G10L 19/24* (2013.01); *G10L 19/022* (2013.01); *G10L 19/0204* (2013.01); *H03H 17/0621* (2013.01); *H03H 2218/14* (2013.01)

(58) Field of Classification Search
CPC ....................... H03H 17/0621; H03H 2218/14
See application file for complete search history.

(56) References Cited

U.S. PATENT DOCUMENTS

| 6,714,826 B1 | 3/2004 | Curley et al. |
| 2002/0099458 A1 | 7/2002 | Rudolph |
| (Continued) | | |

FOREIGN PATENT DOCUMENTS

| WO | 9103790 A1 | 3/1991 |
| WO | 2013142650 A1 | 9/2013 |

OTHER PUBLICATIONS

English translation of the International Written Opinion dated Sep. 24, 2015 for corresponding International Application No. PCT/FR2014/053285, filed Dec. 11, 2014.
(Continued)

*Primary Examiner* — Qian Yang
(74) *Attorney, Agent, or Firm* — David D. Brush; Westman, Champlin & Koehler, P.A.

(57) ABSTRACT

A method for resampling an audio-frequency signal with an output sampling frequency, for a current signal frame. The method is used when the preceding frame is sampled at a first sampling frequency which is different from a second sampling frequency of the current frame. The method includes: determining a first and second segments of the signal by adding samples at zero at the end of stored samples of the preceding frame and at the start of samples of the current frame, respectively; obtaining the first resampled segment and the second resampled segment by applying at least one resampling filter respectively to the first segment resampling the first frequency at the output frequency, and to the second segment resampling the second frequency at the output frequency; and combining the overlapping por-
(Continued)

tion of the first and second resampled segments to obtain at least one portion of the resampled current frame.

9 Claims, 11 Drawing Sheets

(51) Int. Cl.
*G10L 19/02* (2013.01)
*G10L 19/022* (2013.01)

(56) References Cited

U.S. PATENT DOCUMENTS

| | | |
|---|---|---|
| 2004/0184573 A1 | 9/2004 | Anderson et al. |
| 2006/0214938 A1 | 9/2006 | Takada |
| 2007/0025482 A1 | 2/2007 | Wells et al. |
| 2008/0154584 A1* | 6/2008 | Andersen ............. G10L 19/005 704/211 |
| 2009/0234645 A1* | 9/2009 | Bruhn .................... G10L 19/24 704/205 |
| 2010/0198586 A1* | 8/2010 | Edler .................. G10L 19/0212 704/203 |
| 2011/0054913 A1 | 3/2011 | Yu et al. |
| 2011/0161088 A1* | 6/2011 | Bayer .................. G10L 19/167 704/500 |
| 2011/0305352 A1* | 12/2011 | Villemoes ........... G10L 21/0388 381/98 |
| 2012/0209612 A1* | 8/2012 | Bilobrov ................ G11B 27/28 704/270 |
| 2013/0073296 A1* | 3/2013 | Bayer ................... G10L 19/022 704/500 |
| 2013/0096913 A1 | 4/2013 | Bruhn et al. |
| 2016/0232907 A1* | 8/2016 | Kovesi ................... G10L 19/04 |

OTHER PUBLICATIONS

International Search Report dated Sep. 24, 2015 for corresponding International Application No. PCT/7R2014/053285, filed Dec. 11, 2014.
Written Opinion dated Sep. 24, 2015 for corresponding International Application No. PCT/FR2014/053285, filed Dec. 11, 2014.
G. Roy, P. Kabal, "Wideband CELP speech coding at 16 kbits/sec", ICASSP 1991.
C. Laflamme et al., "16 kbps wideband speech coding technique based on algebraic CELP", ICASSP 1991.
R. W. Schafer, L. R. Rabiner, "A Digital Signal Processing Approach to Interpolation", Proceedings of the IEEE, vol. 51, No. 6, Jun. 1973, pp. 692-702.
P. A. Regalia, S. K. Mitra, P. P. Vaidyanathan, "The Digital All-Pass Filter: A Versatile Signal Processing Building Block", Proceedings of the IEEE, vol. 76, No. 1, Jan. 1988.

* cited by examiner

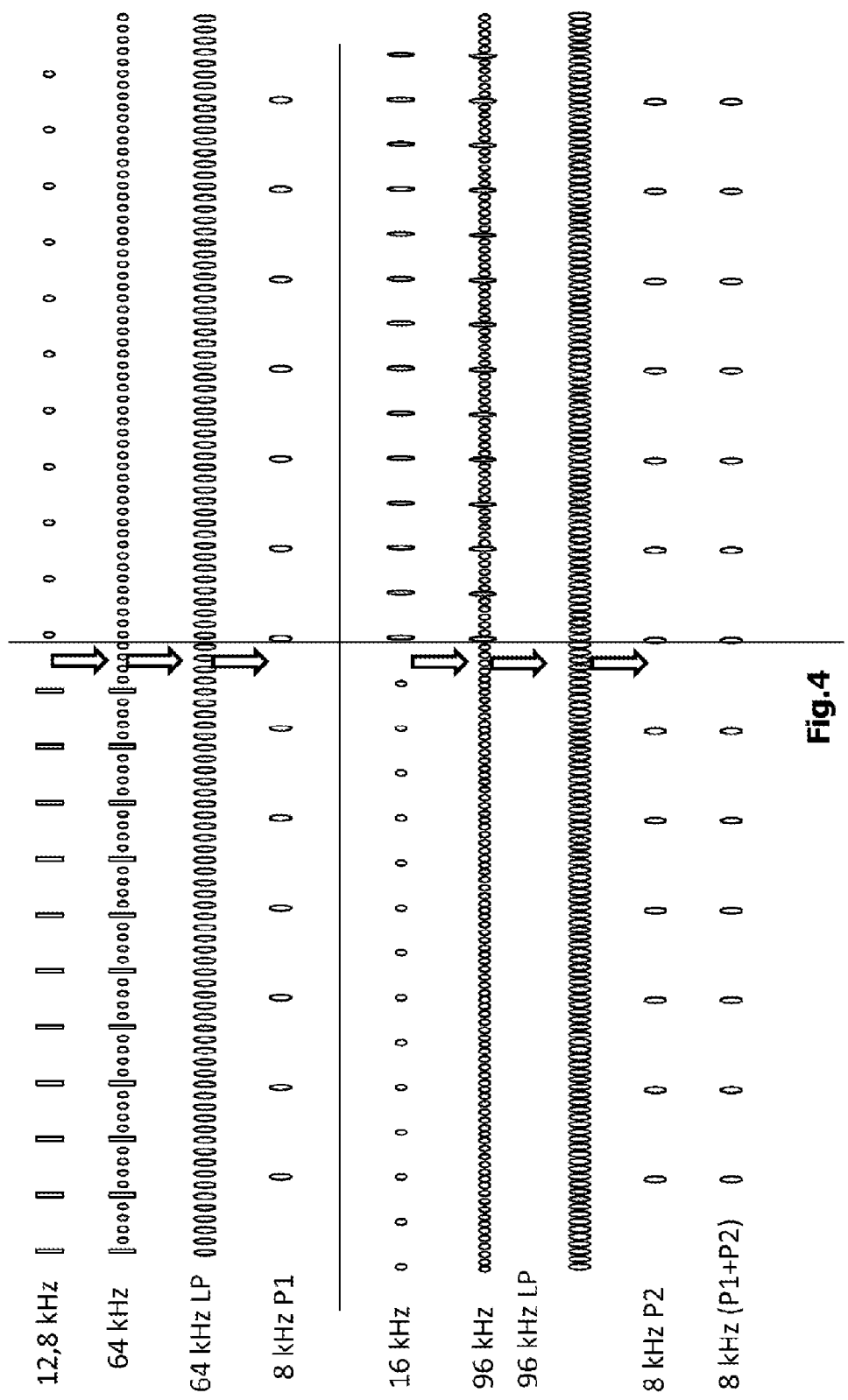

RESAMPLING OF AN AUDIO SIGNAL INTERRUPTED WITH A VARIABLE SAMPLING FREQUENCY ACCORDING TO THE FRAME

CROSS-REFERENCE TO RELATED APPLICATIONS

This application is a Section 371 National Stage application of International Application No. PCT/FR2014/053285, filed Dec. 11, 2014, the content of which is incorporated herein by reference in its entirety, and published as WO 2015/092229 on Jun. 25, 2015, not in English.

FIELD OF THE DISCLOSURE

The present invention relates to the processing of an audio frequency signal for the transmission or storage thereof. More particularly, the invention relates to a change of sampling frequency from one frame to another, notably in a coding or a decoding of the audio frequency signal.

BACKGROUND OF THE DISCLOSURE

The invention applies more particularly to the case of a coding or a decoding by linear prediction, including coding/decoding of CELP (Coded Excitation Linear Prediction) type. The linear prediction codecs, such as the codecs of ACELP (Algebraic Coded Excitation) type, are reputed to be suited to speech signals, modeling the production thereof well.

The sampling frequency at which the CELP coding algorithm operates is generally predetermined and identical in each coded frame; examples of sampling frequencies are:
  8 kHz in the CELP coders defined in ITU-T G.729, G.723.1, G.729.1
  12.8 kHz for the CELP part of the 3GPP AMR-WB coders, ITU-T G.722.2, G.718
  16 kHz in the coders described for example in the articles by G. Roy, P. Kabal, "Wideband CELP speech coding at 16 kbits/sec", ICASSP 1991, and by C. Laflamme et al., 16 kbps "wideband speech coding technique based on algebraic CELP", ICASSP 1991.

When the sampling frequency of the signal at the input or at the output of the codec is not identical to the internal CELP coding frequency, a resampling is needed. For example:
  In the 3GPP AMR-WB codecs, ITU-T G.722.2, the wideband input and output signal is sampled at 16 kHz but the CELP coding works at the frequency of 12.8 kHz. It will be noted that the ITU T G.718 and G.718 Annex C codecs work also with input/output frequencies of 8 and/or 32 kHz, with a CELP core at 12.8 kHz.
  In the ITU-T G.729.1 codec, the input signal is normally wideband (at 16 kHz) and the low band (0-4 kHz) is obtained by a bank of filters of QMF type to obtain a signal sampled at 8 kHz before coding by a CELP algorithm derived from the ITU-T G.729 and G.729 Annex A codecs.

Different methods for changing sampling frequency, also called resampling, of a digital signal are known, by using, for example in a nonexhaustive manner, up-sampling and down-sampling operations combined with an FIR (Finite Impulse Response) filtering, an IIR (Infinite Impulse Response) filtering or, more directly, a polynomial interpolation (including the splines). A review of the conventional resampling methods can be found for example in the article by R. W. Schafer, L. R. Rabiner, A Digital Signal Processing Approach to Interpolation, Proceedings of the IEEE, vol. 61, no. 6, June 1973, pages 692-702.

The advantage of FIR filtering (symmetrical) lies in its simplified implementation and—subject to certain conditions—in the possibility of ensuring a linear phase. A filtering with linear phase makes it possible to preserve the waveform of the input signal, but it can also be accompanied by a temporal spreading ("ringing") that can create artifacts of pre-echo type on transients. This method results in a delay (which is a function of the length of the impulse response), generally of the order of one to a few ms to ensure appropriate filtering characteristics (in-band ripple, rejection level sufficient to eliminate aliasing or spectral images, etc.).

The alternative of a resampling by IIR filtering generally leads to a non linear phase, unless the phase is compensated by an additional all-pass filtering stage, as described for example in the article by P. A. Regalia, S. K. Mitra, P. P. Vaidyanathan, The Digital All-Pass Filter: A Versatile Signal Processing Building Block, Proceedings of the IEEE, vol. 76, no. 1, January 1988, with an example of implementation in the "iirgrpdelay" routine of the MATLAB software; an IIR filter is generally of lower order but more complex to implement in fixed point notation, the states (or memories) of the filter being able to reach values of high dynamic range for the recursive part, and this problem is amplified if a phase compensation by all-pass filtering is used.

A resampling technique is described, for example, in ITU-T recommendation G.722.2 (also called AMR-WB standard) describing the AMR-WB codecs. In this standard, the input signal sampled at 16 kHz is divided into 20 ms frames and down-sampled at an internal frequency of 12.8 kHz before applying a coding of CELP type; the signal decoded at 12.8 kHz is then resampled at 16 kHz and combined with a high-band signal. The advantage of going through an intermediate frequency of 12.8 kHz is that it makes it possible to reduce the complexity of the CELP coding and also to have a frame length which is a power of 2, which simplifies the coding of some CELP parameters. The method used in AMR-WB is a conventional resampling by a factor of 4/5 by FIR filtering (with an impulse response of 121 coefficients at 64 kHz).

In theory, the FIR resampling by a factor of 4/5 in the AMR-WB coder can be performed according to the following steps:
  up-sampling by 4 (from 16 kHz to 64 kHz) by addition of 3 samples at 0 after each input sample at 16 kHz;
  low-pass filtering at the frequency of 64 kHz by a transfer function $H_{decim}(Z)$ of symmetrical FIR type of order 120 and of cutoff frequency close to 64 kHz;
  down-sampling by 5 (from 64 kHz to 12.8 kHz) by keeping only one sample in five of the signal at the output of the filter $H_{decim}(Z)$.

In practice, this resampling is implemented in an equivalent manner in the AMR-WB coder according to a polyphase implementation without calculating the intermediate signal at 64 kHz and therefore without explicitly adding zeros to the signal to be converted. For each sample at 12.8 kHz at the output of the resampling, an FIR filtering is applied at 16 kHz by using a "phase" of the impulse response of the filter $H_{decim}(Z)$, which is equivalent to an FIR filter of order 30 at 16 kHz with a delay of 15 samples at 16 kHz, i.e. 0.9375 ms.

Interest here is focused on a category of codecs supporting at least two internal sampling frequencies, the sampling frequency being able to be selected adaptively in time and variable from one frame to another. Generally, for a range of "low" bit rates, the CELP coder will work at a lesser sampling frequency, for example $fs_1=12.8$ kHz and, for a range of higher bit rates, the coder will work at a higher frequency, for example $fs_2=16$ kHz. A change of bit rates over time, from one frame to another, will in this case bring about a switchover between these two frequencies ($fs_1$ and $fs_2$) depending on the range of bit rates covered. This frequency switchover between two frames can cause audible and objectionable artifacts, particularly because the resampling memories have to be correctly defined and they are not directly accessible when the frequency of the resampling input signal is variable.

When the internal CELP decoding frequency is different from the output frequency, a resampling of the signal synthesized by the CELP decoder will then have to be performed to a common output frequency of the codec $fs^{out}$, defined for the duration of the coded sequence (or of the communication).

Now, the resampling methods that exist in the prior art are generally defined between fixed frequencies before and after resampling. These methods do not make it possible to perform a resampling of a signal where the frequency before and/or after resampling is variable per frame and notably the case where a resampling at a first frequency on a signal frame is performed while the preceding frame has a sampling frequency different from the first.

There is therefore a need to ensure an optimal resampling (without audible and objectionable artifacts) of each frame in the case of a codec having at least two different sampling frequencies.

SUMMARY

An exemplary embodiment of the present disclosure proposes a method for resampling an audio frequency signal at an output sampling frequency, for a current signal frame. The method is applied in the case where the preceding frame is sampled at a first sampling frequency different from a second sampling frequency of the current frame, and is such that it comprises the following steps:
determination of a first signal segment by addition of a first predetermined number of samples at zero at the end of stored samples of the preceding frame;
obtaining of the first resampled segment by application to the first segment of at least one resampling filter resampling from the first frequency to the output frequency;
determination of a second signal segment by addition of a second predetermined number of samples at zero at the start of samples of the current frame;
obtaining of the second resampled segment by application to the second segment of at least one resampling filter resampling from the second frequency to the output frequency;
combination of the overlapping part of the first and second resampled segments to obtain at least a part of the current resampled frame.

Thus, the switchover between the current frame and the preceding frame sampled at different frequencies is performed in such a way as to avoid the objectionable artifacts. In effect, the combination of segments taking into account both the resampling of a part of the signal of the preceding frame and of the signal of the current frame makes it possible to obtain this soft transition.

The various particular embodiments mentioned hereinbelow can be added independently or in combination with one another, to the steps of the resampling method defined above.

In a particular embodiment, in the case where the first sampling frequency is lower than the second sampling frequency, the obtaining of the second resampled segment comprises the following steps:
obtaining of a transition segment by resampling from the second frequency at the output frequency, of the second segment, over a limited frequency band;
obtaining of a second intermediate resampled segment by resampling from the second frequency to the output frequency, of the second segment;
application of a cross-fading function to at least a part of the transition and intermediate segments.

Thus, the switchover between the different frequency bandwidths is not performed abruptly, the cross-fading between the resampled segments allows for a soft transition to change from one bandwidth to another.

In a variant embodiment, particularly suited to the case where the resampling is performed by filter bank, in the case where the first sampling frequency is lower than the second sampling frequency, the obtaining of the second resampled segment comprises the following steps:
obtaining of a sub-band division in at least the second segment;
application of a weighting function to at least a sub-band of the second segment;
obtaining of the second resampled segment by recombination of the sub-bands comprising at least the one that is weighted.

Similarly, in the case where the first sampling frequency is higher than the second sampling frequency, the obtaining of the first resampled segment comprises the following steps:
obtaining of a transition segment by resampling from the first frequency to the output frequency, of the first segment, over a limited frequency band;
obtaining of a first intermediate resampled segment by resampling from the first frequency to the output frequency, of the first segment;
application of a cross-fading function to at least a part of the transition and intermediate segments.

In an advantageous embodiment, the method comprises a step of multiplication of the current resampled frame resulting from the combination step, by a weighting signal.

Thus, the weighting signal makes it possible to compensate for the energy fluctuation which might have occurred in the resampling steps.

The invention applies also to a method for decoding a current frame of an audio frequency signal comprising a step of selection of a decoding sampling frequency, such that, in the case where the preceding frame is sampled at a first sampling frequency different from a second sampling frequency of the current frame, the method comprises a resampling as described previously.

The invention relates to a device for resampling an audio frequency signal at an output sampling frequency, for a current signal frame. The device is applied in the case where the preceding frame is sampled at a first sampling frequency different from a second sampling frequency of the current frame, and;
a module for determining a first signal segment by addition of a first predetermined number of samples at zero at the end of stored samples of the preceding frame;
a resampling module capable of obtaining a first resampled segment by application to the first segment of at least one resampling filter resampling from the first frequency to the output frequency;

a module for determining a second signal segment by addition of a second predetermined number of samples at zero at the start of samples of the current frame;

a resampling module capable of obtaining a second resampled segment by application to the second segment of at least one resampling filter resampling from the second frequency to the output frequency; and a combination module capable of combining the overlapping part of the first and second resampled segments to obtain at least a part of the current resampled frame.

This device offers the same advantages as the method described previously that it implements.

The present invention also targets an audio frequency signal decoder comprising a module for selecting a decoder sampling frequency and at least one resampling device as described.

The invention targets a computer program comprising code instructions for the implementation of the steps of the resampling method as described, when these instructions are executed by a processor.

Finally, the invention relates to a processor-readable storage medium, incorporated or not in the resampling device, possibly removable, storing a computer program implementing a resampling method as described previously.

BRIEF DESCRIPTION OF THE DRAWINGS

Other features and advantages of the invention will become more clearly apparent on reading the following description, given purely as a nonlimiting example, and with reference to the attached drawings, in which:

FIG. 4 illustrates an example of resampling according to the first embodiment of the invention;

DETAILED DESCRIPTION OF ILLUSTRATIVE EMBODIMENTS

By convention, the sampling frequencies external to the codecs are denoted with an exponent (e.g. $fs^{in}$, $fs^{out}$) and the internal sampling frequencies are denoted with an index (e.g. $fs_1$, $fs_2$, $fs_{old}$, $fs_{new}$).

Figure 1:
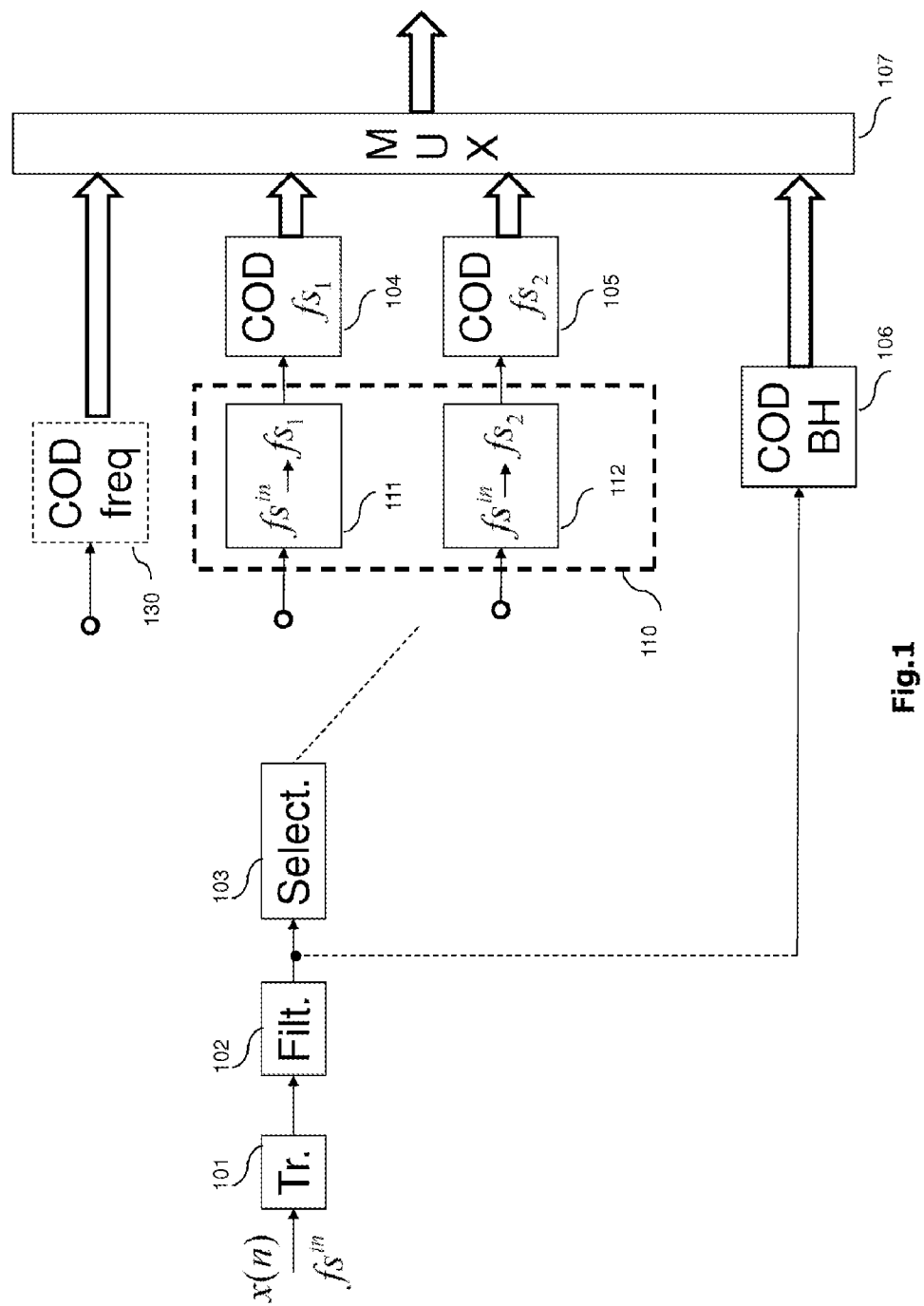
FIG. 1 illustrates an example of a coder comprising coding modules working at different sampling frequencies and resampling devices.

FIG. 1 describes an example of a code in which at least one resampling device is incorporated. The input signal x(n) (mono) is clocked at the frequency $fs^{in}$, where $fs^{out}$ can take the values of 8, 16, 32 or 48 kHz.

This input signal is divided (block 101) into 20 ms frames which are processed sequentially. Each frame of the input signal is, if necessary, filtered by a high-pass filter 102 to eliminate the continuous component (generally an IIR filter of order 1 or 2 with a cutoff frequency around 50 Hz), then a resampling is applied to find a "low band" signal, which can be sampled at the frequency $fs_1$ and/or at the frequency $fs_2$. In the embodiment described here, $fs_1$=12.8 kHz and $fs_2$=16 kHz.

In one possible embodiment, to simplify the management of the resampling memories on the coder, the two downsampling operations 111 and 112 of the resampling device 110 are performed in parallel for each frame. However, when the resampling is done by using a filtering of FIR (Finite Impulse Response) type or a filter bank whose states are determined from the latest samples of the preceding past input signal frame, it is possible to perform only a single operation (per frame) to the frequency $fs_1$ or $fs_2$ depending on the current frame to be coded—in effect, with a filtering of FIR type or a filter bank with suitable states, it is possible to obtain the past signal at the common frequency $fs^{in}$, and it is then sufficient to update the filtering memory or the filter bank in the case of internal frequency switchover according to the past signal. In this case, a selection module 103 makes it possible to choose which resampling operation 111 or 112 is to be performed as a function of the current frame to be processed.

It will also be noted that, in the particular case where $fs^{in}$=8 kHz, only the frequency $fs_1$=12.8 kHz will be able to be used, since it is sufficient to cover the band to be coded (0-4 kHz) and there is no need to use the frequency $fs_2$=16 kHz. The "low-band" signal terminology is however retained for the signal resampled with an input at 8 kHz.

Moreover, for the input frequencies $fs^{in}$≥16 kHz, the coder can calculate a high-band signal in order to transmit band extension parameters after coding at 106—the only case where such a high-band signal is not calculated corresponds to the case where the internal CELP coding frequency is selected at $fs_2$=16 kHz for $fs^{in}$=16 kHz, because the band to be coded is then fully covered.

In the embodiment described here, it is considered that, for the bit rates<24.4 kbit/s, the coder selects at 103 $fs_{celp}$=$fs_1$=12.8 kHz and, for the bit rates 24.4 kbit/s, the coder selects $fs_{celp}$=$fs_2$=16 kHz. In variants, the selection of the internal frequency will be able to be implemented according to criteria other than the bit rate, or the threshold of 24.4 kbit/s will be able to be set at another value.

In a particular embodiment, the resampling at 110 of the input frequency $fs^{in}$ to the internal frequency $fs_1$ and/or $fs_2$ is performed by a polyphase FIR filter in a manner similar to that performed in the G.718 codec. The different FIR filters used are specified in table 1 below

TABLE 1

| Internal/input frequency $fs^{in}$ (kHz) | 8 | 16 | 32 | 48 |
|---|---|---|---|---|
| 12.8 | f_8_120 | f_15_180 | f_15_180 | f_15_180 |
| 16 | Case not used | Offset only | f_12_180 | f_12_180 | in which, with no loss of generality, the FIR filters are designed according to the conventional method called "window method" (because it involves the windowing of a cardinal sine) as explained below.

For example, the filter f_8_120 is obtained with the following matlab command:

f_8_120=fir1(240,(3900/32000),hanning(241))*5;

with a cutoff frequency (−6 dB) at 64 kHz of 3900 Hz.

These coefficients are used as a 16-coefficient filter at 8000 Hz (i.e. 128 coefficients at 64 000 Hz) and as a 24-coefficient filter at 12 800 Hz (i.e. 120 coefficients at 64 000 Hz, disregarding the last values).

The filter f_12_180 is obtained with the following matlab commands:

ftmp=fir1(358,1/12,hanning(359));
f_12_180=[0 ftmp/ftmp(180) 0];

with a cutoff frequency (−6 dB) at 192 kHz of 8000 Hz.

The filter f_15_180 is obtained with the following matlab commands:

ftmp=fir1(358,1/15,hanning(359));
f_12_180=[0 ftmp/ftmp(180) 0];

with a cutoff frequency (−6 dB) at 192 kHz of 6400 Hz.

Since the codec is flexible in terms of bit rates and sampling frequencies, a number of resampling configurations from a frequency $fs_a$ to $fs_b$ are necessary. In an embodiment described here, the configurations used are listed in table 2 below:

TABLE 2

| Conversion configuration ($fs_a$ -> $fs_b$) | FIR filter used | filt_len (polyphase) | fac_num | fac_den |
|---|---|---|---|---|
| 8000 Hz -> 12800 Hz | f_8_120 | 15 | 8 | 5 |
| 12800 Hz -> 8000 Hz | f_8_120 | 24 | 5 | 8 |
| 16000 Hz -> 8000 Hz | f_12_180 | 30 | 6 | 12 |
| 12800 Hz -> 16000 Hz | f_15_180 | 12 | 15 | 12 |
| 12800 Hz -> 32000 Hz | f_15_180 | 12 | 15 | 6 |
| 12800 Hz -> 48000 Hz | f_15_180 | 12 | 15 | 4 |
| 16000 Hz -> 12800 Hz | f_15_180 | 15 | 12 | 15 |
| 16000 Hz -> 32000 Hz | f_12_180 | 15 | 12 | 6 |
| 16000 Hz -> 48000 Hz | f_12_180 | 15 | 12 | 4 |
| 32000 Hz -> 12800 Hz | f_15_180 | 30 | 6 | 15 |
| 32000 Hz -> 16000 Hz | f_12_180 | 30 | 6 | 12 |
| 48000 Hz -> 12800 Hz | f_15_180 | 45 | 4 | 15 |
| 48000 Hz -> 16000 Hz | f_12_180 | 45 | 4 | 12 |

In this table, the frequency values in bold indicate "external" (that is to say input and/or output) frequencies of the codec, and the other frequency values are "internal" sampling frequencies for the coding of the low band of the signal. The filt_len values correspond to the filtering (and resampling) delay relative to the resampling input frequency. In general, the delay at the output sampling frequency of the resampling is therefore rounded to the lower integer of filt_len*fac_num/fac_den, where filt_len is the length of the filter (polyphase), fac_num is the up-sampling factor and fac_den is the down-sampling factor.

It will be noted that the resampling delay is 0.9375 ms in all the configurations, except in the configurations involving the frequency of 8 kHz—in this case, the delay is twice as long, but a prediction mechanism combined with the FIR filtering will be able to be used to reduce this delay to the same delay value of 0.9375 ms (this mechanism is not detailed here because it goes beyond the scope of the invention).

In variants of the invention, other resampling methods are possible in the coder, in particular by using other FIR filters, IIR filters instead of the FIR filters, or even a filter bank or QMF filters.

A CELP coding is then applied to the ("low band") signal sampled at $fs_1$ or $fs_2$. This coding is performed either by the coding module 104 for the sampling frequency $fs_1$ or by the coding module 105 for the sampling frequency $fs_2$. The coded signals are then multiplexed at 107 before being transmitted or stored.

It is important to stress here that it is assumed that the signal frame to be coded in low band by CELP coding at the frequency $fs_1$ is (temporally) synchronized with the signal frame to be coded in low band by CELP coding at the frequency $fs_2$. This means that the resampling delays from $fs^{in}$ to $fs_1$ and from $fs^{in}$ to $fs_2$ are identical. Furthermore, the future ("lookahead") signal lengths of the two CELP coders 104 and 105 at the frequencies $fs_1$ and of $fs_2$ are identical. In variants of the invention, it is possible to lift these constraints of temporal alignment (on the "lookahead" and the resampling delay) by temporally resetting (before and/or after coding) the respective inputs and/or syntheses of the CELP coders 104 and 105, but such variants seem less advantageous because they necessarily increase the overall coding delay.

In the preferred embodiment, the resampling delay is 0.9375 ms and the "lookahead" is set at 5 ms for the 2 CELP coders used. In variants, other delay and "lookahead" length values can be used.

In a preferred embodiment, the CELP coder at the frequency $fs_1$=12.8 kHz (block 104) uses the ITU-T G.718 coding algorithm, but the 8 kbit/s G.718 CELP coding bit rate (operating at 12.8 kHz) is extended to cover bit rates ranging from 7.2 kbit/s to 16.4 kbit/s. The coding is thus performed on a pre-emphasized version of the signal sampled at 12.8 kHz by a filter of type $1-\alpha_1 z^{-1}$, where $\alpha_1$=0.68. This coder works with $N_1$=4 5 ms subframes and 2 LPC filters of order $M_1$=16 for frames with an interpolation of the LPC filter in the ISF ("Immittance Spectral Frequencies") range over $N_1$ subframes. In variants, the CELP coder will be able to be derived from another coder, for example 3GPP AMR-WB, the LPC parameters will be able to be coded for example in the LSF (Line Spectral Frequencies) range; the values of $\alpha_1$, $N_1$, $M_1$ will also be able to be different which includes the case where $\alpha_1$=0.

In the preferred embodiment, the CELP coder at the frequency $fs_2$=16 kHz (block 105) is a 16 kHz adaptation of the ITU-T G.718 coder, this algorithm is also extended to cover bit rates ranging from 24.4 to 64 kbit/s, with either 4 or 5 subframes of identical length.

The coding is thus performed on a pre-emphasized version of the signal sampled at 16 kHz by a filter of type $1-\alpha_2 z^{-1}$ where $\alpha_2$=0.68. This coder works with $N_2$=5 4 ms subframes and 2 LPC filters of order $M_2$=16 by frames with an interpolation of the LPC filter in the ISF range over $N_2$ subframes. Here again, in variants, the 16 kHz CELP coder will be able to be different, the LPC parameters will be able to be coded in the LSF range; the values of $\alpha_2$, $N_2$, $M_2$ will also be able to be different, with, for example, $\alpha_2$=0.75, $N_2$=4, $M_2$=18.

The problem of the updating of the states of the coder upon a switchover from the frequency $fs_1$ to the frequency $fs_2$ is not addressed here.

The coder according to the invention also provides for the use of additional coding modes, such as a coding by frequency transform (block 130).

Similarly, it will be noted that preprocessing operations (classification of the signal, detection of voice activity, etc.) can be pooled between the two CELP coding variants operating at the frequencies $fs_1$ and $fs_2$, and these operations are not described in detail because they go beyond the scope of the invention.

In variants of the invention, other coders will be able to be used, for example CELP coding variants or coding according to models of BroadVoice™ or SILK type known from the prior art, or even coders of transform type.

Figure 2:
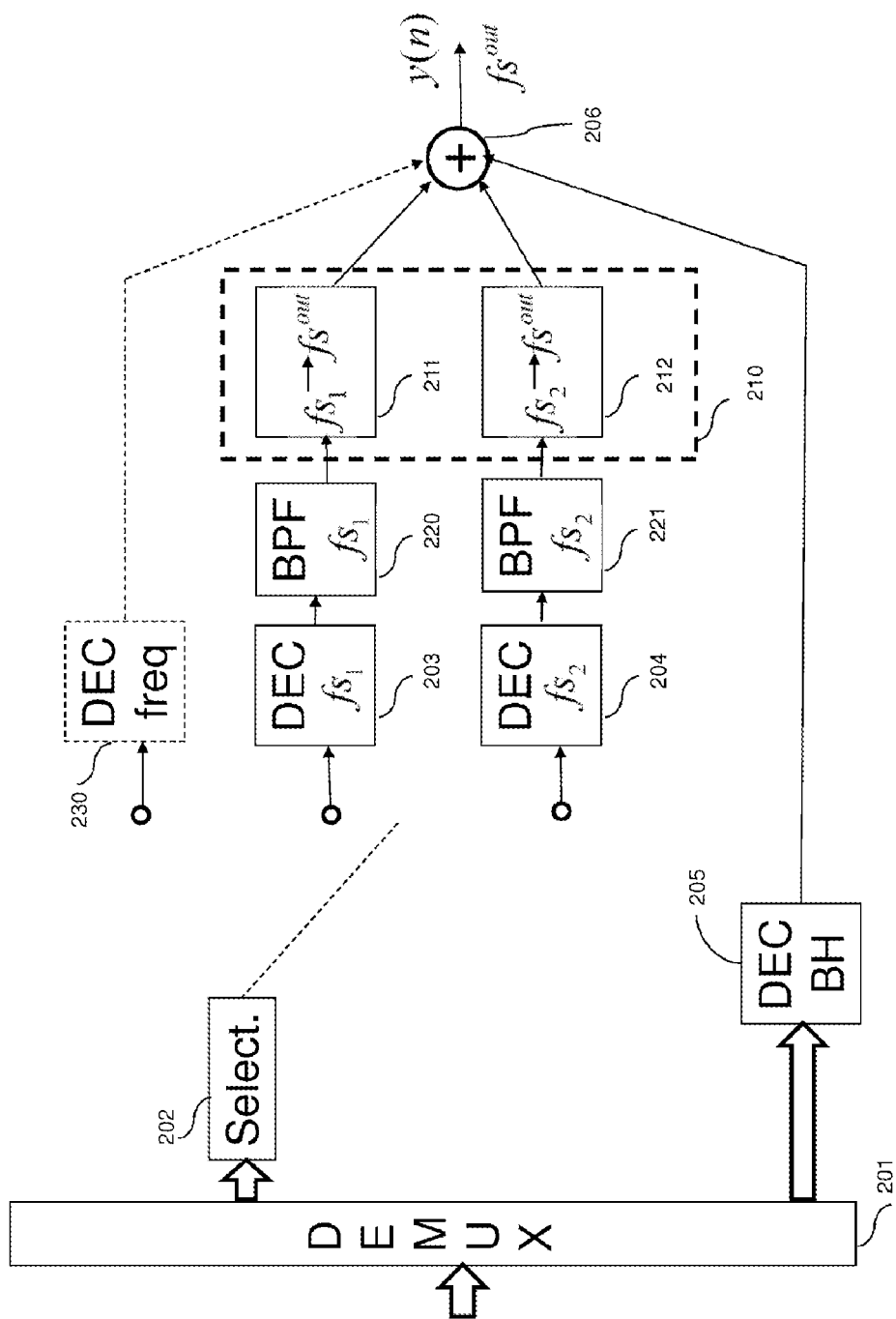
FIG. 2 illustrates an example of a decoder comprising decoding modules working at different sampling frequencies, and resampling devices according to an embodiment of the invention.

FIG. 2 now describes an example of a decoder comprising a resampling device 210 within the meaning of the invention. The output signal y(n) (mono) is sampled at the frequency $fs^{out}$ which can take the values of 8, 16, 32 or 48 kHz.

For each frame received, the bit stream is demultiplexed at 201 and decoded. The decoder determines at 202, here as a function of the bit rate of the current frame, the frequency $fs_1$ or $fs_2$ at which to decode the information from the CELP coder. According to the sampling frequency, either the decoding module 203 for the frequency $fs_1$ or the decoding module 204 for the frequency $fs_2$ is implemented to decode the signal received.

In a manner similar to the coder, the CELP decoder working at the frequency $fs_1=12.8$ kHz (block 203) is a multiple bit rate extension of the ITU-T G.718 decoding algorithm initially defined at 8 kbit/s. In particular, it comprises the decoding of the CELP excitation and a linear prediction synthesis filtering $1/\hat{A}_1(z)$.

The CELP decoder working at the frequency $fs_2=16$ kHz (block 204) is a 16 kHz multiple bit rate extension of the ITU-T G.718 decoding algorithm initially defined at 8 kbit/s and at 12.8 kHz.

The implementation of the CELP decoding at 16 kHz is not detailed here because it goes beyond the scope of the invention.

The problem of the updating of the states of the CELP decoder upon a switchover from the frequency $fs_1$ to the frequency $fs_2$ is not addressed here.

The output of the CELP decoder in the current frame is then post-filtered in a manner similar to the "bass post-filter" (BPF) of the ITU-T G.718 codec (block 220 or 221), then resampled at the output frequency $fs^{out}$, with, for example, $fs^{out}=32$ kHz. This amounts to performing either a resampling from $fs_1$ to $fs^{out}$, at 211, or a resampling from $fs_2$ to $fs^{out}$ at 212 in the resampling device 210.

The problem of the updating of the states of the post-filter (BPF) upon a switchover from the frequency $fs_1$ to the frequency $fs_2$ is not addressed here.

In variants, other post-processing operations (high-pass filtering, etc.) will be able to be used in addition to or instead of the blocks 220 and 221.

It will be noted that the signal output from the CELP decoding undergoes two consecutive delays, a delay due to the "bass post-filter" (BPF) then a delay due to the resampling. In variants of the invention, no post-filter as carried out in the G.718 codec (BPF) will be used, which will eliminate the associated delay. In all cases, the invention is independent of the use of a post-filter after decoding at the frequencies $fs_1$ or $fs_2$.

Whereas on the coder the two resampling operations can work in parallel with states that are distinct and updated constantly or when an internal coding frequency switchover is observed, on the decoder, the two resamplings work alternately and the resampling input frequency is not common (identical).

Furthermore, depending on the output frequency $fs^{out}$, a high-band signal (resampled at the frequency $fs^{out}$) decoded by the decoding module 205 can be added at 206 to the resampled low-band signal.

As with the coder, the decoder also provides the use of additional decoding modes, such as a decoding by inverse frequency transform (block 203).

As detailed hereinbelow with reference to FIG. 3 and FIGS. 5a and 5b, the resampling device implements a resampling method which makes it possible to ensure a continuity of the resamplings in each frame, avoids in particular bandwidth switchover artifacts between the width $[0, fs_1/2]$ and $[0, fs_2/2]$ and avoids the energy differences at the join of two frames in the case of frequency switchover.

Figure 3:
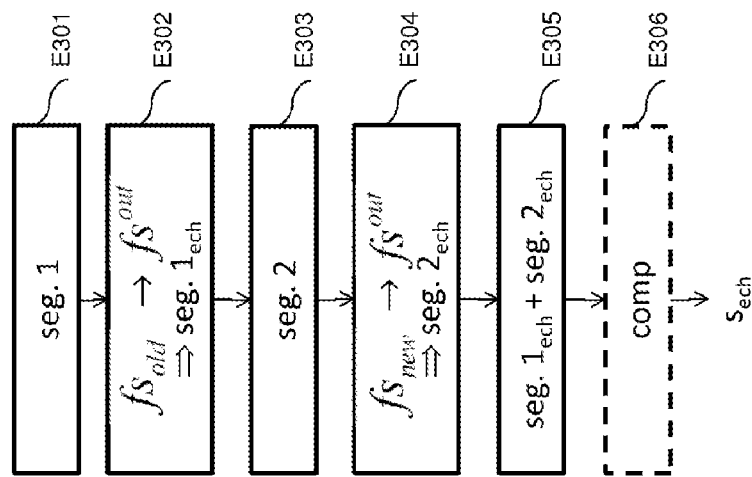
FIG. 3 illustrates, in flow diagram form, a resampling method according to a first embodiment of the invention.

FIG. 3 illustrates, in flow diagram form, the steps implemented in the resampling method according to an embodiment of the invention. Here, the case is assumed in which the frame preceding the current frame to be processed is at a first sampling frequency $fs_{old}$ whereas the current frame is at a second sampling frequency $fs_{new}$. In other words, in an application linked to the decoding, the method according to an embodiment of the invention applies when the internal CELP decoding frequency in the current frame ($fs_{new}$) is different from the internal CELP decoding frequency of the preceding frame ($fs_{old}$): $fs_{new} \neq fs_{old}$.

In a general mode of the resampling method according to the invention, a step E301 of determination of a first signal segment is performed from a stored part of the preceding frame, at the frequency $fs_{old}$. For that, a first predetermined number of samples at zero is added at the end of the samples of the stored part of the preceding frame. This addition of zeros is either explicit by performing the concatenation in a dedicated buffer, or implicit by defining a null signal which complements the signal stored from the preceding frame.

In a particular embodiment, the preceding end-of-frame block of length $2L_{filt}^{old}$, has added to it a future signal of length $2L_{filt}^{old}$ set at zero. It will be noted that the length $L_{filt}^{old}$ makes it possible to compensate the FIR-type filtering delay; this length will be able to be adjusted if other resampling methods, such as a filter bank or a resampling by IIR filter, are used.

The stored samples of the preceding frame constitute the resampling memories, the added zeros corresponding to a "future" signal (in the current frame) at the frequency $fs_{old}$. For example, in the case of resampling using an FIR filtering, the length of these memories and the predetermined number of samples at zero depends on the length of the impulse response of the FIR filter, typically this number is equal to the length of the impulse response of the FIR filter minus 1.

In the step E302, this first segment is resampled to convert it to the frequency $fs^{out}$ from the frequency $fs_{old}$, by generally applying an up-sampling, a resampling filter and a down-sampling to this segment—this step can be optimized by using a polyphase decomposition of the filtering and will be able to be adapted according to the values of the frequencies $fs_{old}$ and $fs^{out}$. To perform this step, the example of implementation of resampling by polyphase FIR filter of the G.718 codec (denoted modify_fs) with the FIR filters defined previously in the tables 1 and 2 will be used again.

A first resampled segment ($seg.1_{ech}$) is then obtained, of which $2L_{over}$ samples are generally different from zero, with $L_{over}=fs^{out} \cdot L_{filt}^{old}/fs^{old}$. It will be noted that the first $L_{over}$ samples at the output of the resampling are associated with the preceding frame whereas the last $L_{over}$ samples are associated with the current frame. In fact, because of the FIR filtering delay, the temporal support of the output of the resampling in the step E302 begins after the first $L_{filt}^{old}$ samples of the first segment seg.1 and ends before the last $L_{filt}^{old}$ samples of the first segment seg.1.

The resampling memory corresponds in this case to the last $2L_{filt}^{old}$ samples of the preceding frame after post-filter (signal at the output of the block 220 if $fs^{old}=12.8$ kHz and at the output of the block 221 if $fs_{old}=16$ kHz). If $fs_{new}=12.8$ kHz, then $fs_{old}=16$ kHz and $L_{filt}^{old}=15$; if $fs_{new}=16$ kHz, then $fs_{old}=12.8$ kHz, $L_{filt}^{old}=12$.

In the step E303, a second segment is determined by adding a second predetermined number of samples at zero at the start of samples of the current frame sampled at the frequency $fs_{new}$. Here again, this addition of zeros is either explicit by performing the concatenation in a dedicated buffer, or implicit by defining a null signal which complements the stored signal of the current frame.

In a particular embodiment, the current frame of length of $L_{frame}^{new}$ has added to it a memory of the past signal of length $2L_{filt}^{new}$ set to zero, to obtain the second segment (seg. 2) (which corresponds to a memory set to 0).

Here again, it will be noted that the length $2L_{filt}^{new}$ makes it possible to compensate the FIR-type filtering delay; this length will be able to be adjusted if other resampling methods are used.

This second segment is resampled in E304 to obtain a segment at the output sampling frequency $fs^{out}$ from the frequency $fs_{new}$, by applying a resampling filter to the second segment. The example of implementation of resampling by polyphase FIR filter of the G.718 codec (denoted modify_fs) with the FIR filters defined previously in the tables 1 and 2 will be used gain.

A second resampled segment (seg.$2_{ech}$) is thus obtained, of which the first $2L_{over}$ samples temporarily correspond to the $2L_{over}$ non-null samples of the first resampled segment. Here again, because of the FIR filtering delay, the temporal support of the output of the resampling in the step E304 is offset by $L_{filt}^{new}$ samples relative to the start of the second segment seg.2 including zeros.

It will be noted that the first $L_{over}$ samples at the output of the resampling are associated with the preceding frame whereas the last $L_{over}$ samples are associated with the current frame.

The step E305 combines the overlapping part of the two resampled segments of length $2L_{over}$ to obtain the end of the resampled preceding frame and at least the start of the resampled current frame ($s_{ech}$). This makes it possible to avoid the artifacts which can appear upon a switchover of frequency between two frames. The method here makes it possible to perform a soft transition between these two sampling frequencies from one frame to the other. It will be noted that, for reasons of efficiency, it is possible to extend the definition of the second segment to include all of the current frame and not just the start of the current frame (necessary for the overlap) during the resampling operation for the second segment.

In a particular embodiment, the combination (addition-overlap) of the two segments resampled at the frequency $fs^{out}$ is performed over the first $2L_{over}$ samples as follows:

$$s_{ech}(n)=\text{seg.}1_{ech}(n)+\text{seg.}2_{ech}(n), n=0,\ldots,2L_{over}-1$$

in which $L_{over}=fs^{out} \cdot L_{filt}^{old}/fs^{old}$

If necessary, an additional step E306 of correction by scaling to the sample is also performed to compensate the energy fluctuation after combination:

$$s_{ech}(n)=w_{comp}(n) \cdot s_{ech}(n), n=0,\ldots,L_{comp}-1$$

in which $L_{comp}=2 L_{over}$ and $w_{comp}(n)$ corresponds to recalculated compensation (or weighting) factors.

The calculation of $w_{comp}(n)$ is obtained in advance and can therefore be prestored. These compensation factors $w_{comp}(n)$ can be obtained as follows: the input samples are replaced by a constant value set to the value of the corresponding up-sampling factor, for example to 5 in the case of up-sampling 12 800 Hz to 64 000 Hz and assuming an FIR filter of gain equal to 1 (otherwise, this constant must be divided by the gain of the FIR filter which is the sum of these coefficients). Next, the resampling is applied to this signal; this operation is repeated for the two segments of predetermined length, the resampled segments are then combined and the result is then used to normalize (divide) the resampled audio signal $s_{ech}(n)$ or, in an equivalent manner, its inverse is used as multiplicative compensation factors $w_{comp}(n)$.

In the embodiment described above, the steps E302 and E304 of obtaining of a resampled segment by application of a resampling filter are performed by the application of a polyphase FIR filter.

These resampling steps can be performed in the same way by a decomposition in three steps: up-sampling to a higher frequency, filtering of low-pass type then down-sampling. An exemplary embodiment of this type is illustrated in FIG. 4.

Thus, FIG. 4 illustrates such a resampling in which $fs_{old}=12.8$ kHz, $fs_{new}=16$ kHz and $fs^{out}=8$ kHz, by using the filters described in table 1 above. According to this table, for the resampling from 12.8 kHz to 8 kHz, the input signal is up-sampled by a factor 5 to 64 kHz (by adding 4 zeros between the samples at 12.8 kHz), a low-pass filter whose cutoff frequency is around 4 kHz is then applied and this signal is finally downsampled by a factor of 8.

For the resampling from 16 kHz to 8 kHz, the input signal is up-sampled by a factor 6 to 96 kHz (by adding 5 zeros between the samples at 16 kHz), the low-pass filter whose cutoff frequency is around 4 kHz is applied and finally this signal is down-sampled by a factor of 12. It should be noted that, in this example, the cutoff frequency of the FIR filters is identical because $fs^{out} > \min(fs_{new}, fs_{old})$.

In FIG. 4, square symbols can be seen at the top which symbolize the samples at 12.8 kHz at the end of the preceding frame; they also constitute the non-null values of the memory of the low-pass FIR filter. The vertical line marks the end of the frame. The circles after the vertical line symbolize the zero values at the end of the first segment. This first line therefore symbolizes the result of the step (E301 of FIG. 3) of determination of the first segment. The next line shows the signal up-sampled to 64 kHz by addition of 4 zeros between the samples at 12.8 kHz. This signal is then low-pass filtered (marked "64 kHz LP" in the figure), then is down-sampled to 8 kHz by keeping only one sample in 8. This signal is called "8 kHz P1" in the figure; it is the first component of the output signal. These three lines symbolize the step (E302 of FIG. 3) of obtaining of the first resampled segment.

On the line marked "16 kHz", the oval symbols symbolize the samples at 16 kHz at the start of the current frame. The circles before the vertical line symbolize the past signal (the memory of the low-pass FIR filter) set to zeros. This line therefore symbolizes the result of the step (E303 of FIG. 3) of determination of the second segment.

The next line shows this signal up-sampled to 96 kHz by addition of 5 zeros between the samples at 16 kHz. This signal is then low-pass filtered (marked "96 kHz LP" in the figure) then is downsampled to 8 kHz by keeping only one sample in 12. This signal is called "8 kHz P2" in the figure; it represents the second component of the output signal. These three lines symbolize the step (E304 of FIG. 3) of obtaining of the second resampled segment.

Finally, these two components, "8 kHz P1" and "8 kHz P2", are combined to form the output signal at 8 kHz (step E305 of FIG. 3). This signal is, if necessary, then weighted to equalize the fluctuation of the energy around the boundary between the frames.

Similarly, in another embodiment, resampling filters different from the polyphase filters can be used such as filter banks for example of QMF type.

In a particular embodiment, for a resampling linked to the output frequency $fs^{out}=8$ kHz, the implementation takes account of the double length of the filters and also of the fact that the band is limited to 4 kHz with no problem of switchover of bandwidth from the internal frequency ($fs_1$ and $fs_2$).

In another particular embodiment, for example, for the other output frequencies, $fs^{out}=16, 32, 48$ kHz, a cross-fade of two components of different bandwidth is implemented to avoid bandwidth switchover artifacts between 6.4 and 8 kHz. In variants, weighting operations will also be able to be performed on the segments before resampling (and not after resampling) to prepare a cross-fade.

The embodiment described previously is now detailed in FIGS. 5a and 5b.

Figure 5B:
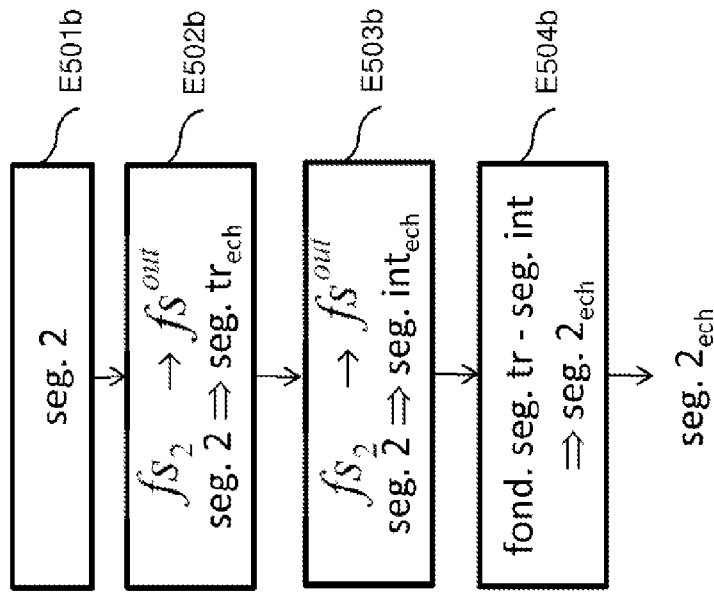
FIGS. 5a and 5b illustrate, in flow diagram form, the steps of a particular embodiment for obtaining a first segment or a second segment according to the invention.
Figure 5A:
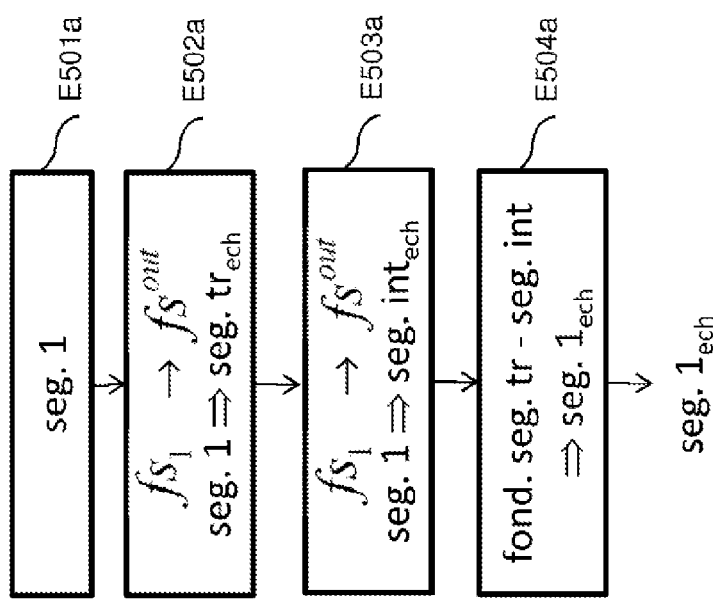

FIG. 5a illustrates the steps implemented to obtain the first sampled segment (seg.$1_{ech}$), in the case where the sampling frequency of the preceding frame is higher than the sampling frequency of the current frame.

Thus, for example, if $fs_1=fs_{old}=16$ kHz (and $fs_2=fs_{new}=12.8$ kHz), the signal of the preceding frame has a 0-8000 Hz frequency band, whereas the signal of the current frame has a 0-6400 Hz frequency band. To avoid band switchover defects, a cross-fade is applied to the signal associated with the end of the preceding frame, that is to say, as described with reference to FIG. 3, to the first segment. The resampling to obtain the first resampled segment (seg.$1_{ech}$) in this case comprises the following steps:

In the step E501a, in this embodiment, the first segment is formed from the preceding frame end block at the output of the post-filter of length $2L_{filt}^{old}=30$ and from a future signal of length $2L_{filt}^{old}$ set to zero.

In the step E502a, a resampling with band limitation to 6.4 kHz (incorporated in the resampling FIR filtering) from the frequency $fs_{old}=16$ kHz to the frequency $fs^{out}$ is implemented. A resampled transition segment seg.$tr_{ech}$ is then obtained.

A resampling memory is used here that corresponds to the last $2L_{filt}^{old}=30$ samples of the signal at the fill output of the post-filter in the preceding frame.

Following this resampling step, the resampled transition segment seg.$tr_{ech}=s_{ringing}^{6.4kHz}$ of length $2L_{over}$ is obtained.

If $fs_{old} \neq fs^{out}$, another resampling step is performed in E503a for the first segment as defined in E501a. The resampling is performed from the frequency $fs_{old}=16$ kHz to the frequency $fs^{out}$. A resampled intermediate segment seg.$int_{ech}=s_{ringing}^{8kHz}$ is then obtained.

If $fs_{old}=fs^{out}$, the intermediate signal seg.$_{int}$ is defined by the $L_{filt}^{old}=15$ samples of the memory ($L_{filt}^{out}=$last 15 samples of the signal at the output of the post-filter in the preceding frame), followed by 15 null samples.

In the step E404a, the two segments, transmission segment (seg.$tr_{ech}=s_{ringing}^{6.4kHz}$) and intermediate segment (seg.$int_{ech}=s_{ringing}^{8kHz}$) are combined to perform a cross-fade, as follows seg.$1_{ech}(n)=\text{fac}(n)s_{ringing}^{6.4kHz}(n)+(1-\text{fac}(n))$
$s_{ringing}^{8kHz}(n), n=0, \ldots, 2L_{over}-1$ in which $(n)=n/L_{over}$, $n=0, \ldots, L_{over}-1$;
fac$(n)=1$, $n=L_{over}, \ldots 2L_{over}-1$;
and $L_{over}=fs^{out} \cdot L_{filt}^{old}/fs^{old}=15 \; fs^{out}/16$ In variants, weighting factors other than the example of linear weighting defined here will be able to be used.

The cross-fade is done according to the preferred embodiment over the first half of the overlap zone. In this case, the calculation of the second half of the intermediate segment $s_{ringing}^{8kHz}$ is not necessary (because it has a zero weight in the cross-fade).

Figure 6A:
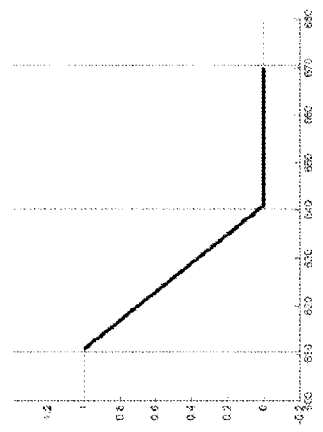
FIGS. 6a to 6d illustrate the characteristics (amplitude or energy) of different signals which occur during the crossfading according to the invention in the case where the first sampling frequency is higher than the second sampling frequency.

An example of resampling with $fs_{old}=16$ kHz, $fs_{new}=12.8$ kHz and $fs^{old}=32$ kHz is illustrated in FIGS. 6a to 6d to show the trend of the energy of the different components. As with the calculation of the compensation factors, each input sample has been replaced by a constant of a value 4 for the input at 16 kHz and by a constant of a value 5 for the input at 12 800 Hz, to preserve the energy (the filter gains have been normalized at 1). FIG. 6a illustrates, by a double-width line, the trend of the energy of the intermediate segment $s_{ringing}^{8kHz}$ at the end of a frame of 640 samples, by using the filter. Before, up to the index 610 (up to the first dotted vertical line) the signal is filtered normally, without the zeros added at the end of the frame. The resampled signal at $fs^{old}=32$ kHz of the part obtained with the input set to zero (also called "ringing"), therefore extends between the indices 611 and 670. The energy of the transition segment $s_{ringing}^{6.4kHz}$ behaves very similarly. The second dotted vertical line corresponds to the end of the input frame which separates the preceding frame (frame N-1) from the current frame (frame N) with $fs_{old}=16$ kHz. It will be observed that, at this point, the energy of this filtered component drops abruptly. Without application of the cross-fade, the bandwidth would change abruptly from 8 kHz to 6.4 kHz, which would cause audible artifacts. To avoid that and ensure soft bandwidth transition, it is desirable to perform a cross-fade only over the first part (first half) of the intermediate segment $s_{ringing}^{8kHz}$ with the corresponding part of the transition segment $s_{ringing}^{6.4kHz}$.

Figure 6B:
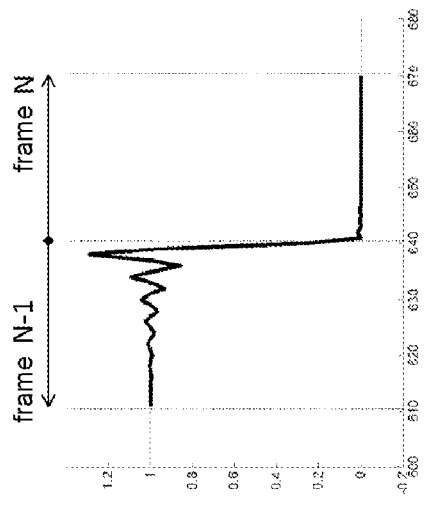
Figure 6C:
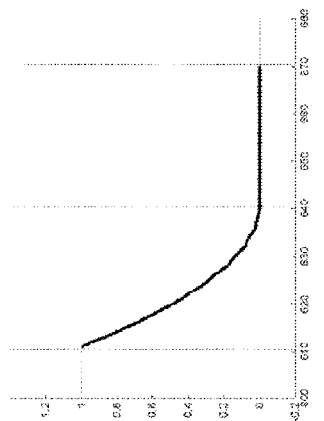
Figure 6D:
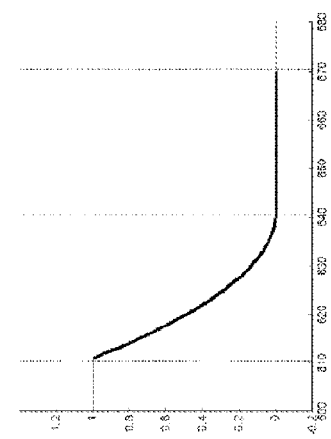

FIG. 6b illustrates such a weighting function $(1-\text{fac}(n))$ to be applied to $s_{ringing}^{8kHz}$ to produce the cross-fade and FIG. 6c gives the energy of this weighting signal. FIG. 6d plots the energy of the intermediate segment $s_{ringing}^{8kHz}$ after weighting. Thus, the energy of the 6.4-8 kHz ringing band decreases also gradually. Other types of cross-fade can also be used with weighting windows that have different definitions without changing the principle of the invention.

Figure 7:
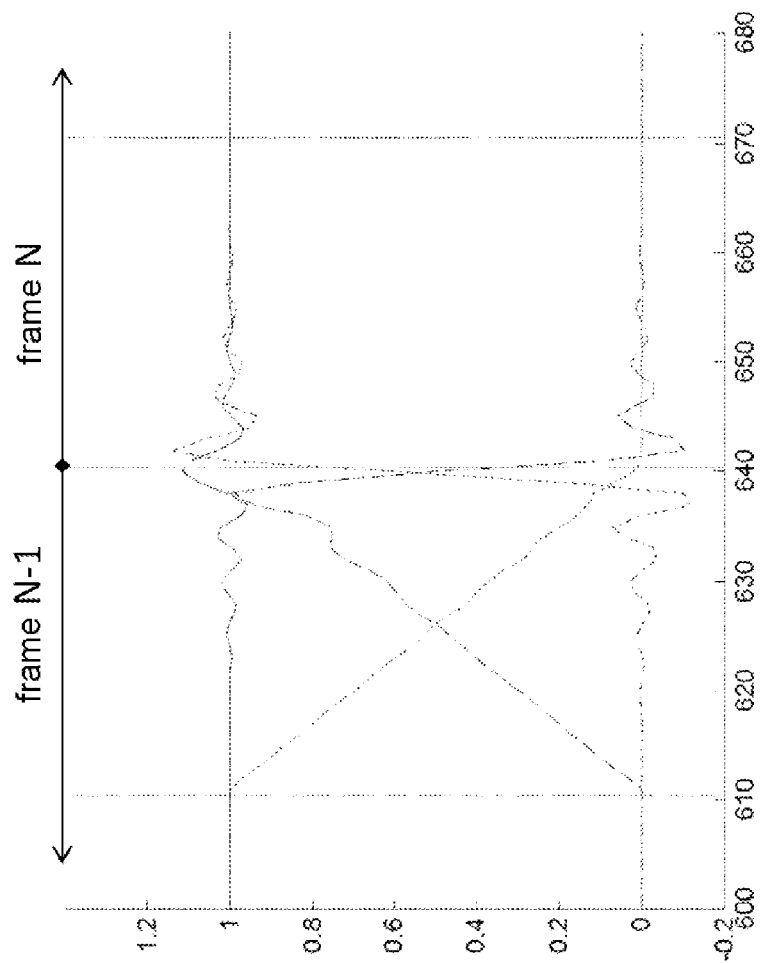
FIG. 7 illustrates the amplitude of the different segments added together in a transition from one sampling frequency to another according to an embodiment of the invention.

FIG. 7 represents the amplitude of 3 components added together upon a transition from one input frequency to another: by dotted line the intermediate segment $s_{ringing}^{8kHz}$ after weighting, by discontinuous line the transition segment $s_{ringing}^{6.4kHz}$ after weighting, by chain-dotted line the first resampled segment seg.$1_{ech}$ and by continuous line the sum of these three segments. On this last curve, the fluctuation of the amplitude (and of the energy) can be observed around the boundary of the frames, the scaling correction corresponds to dividing the output signal by this signal (or, in an equivalent manner, to multiplying by the inverse of this signal previously called $w_{comp}(n)$, weighting factors) to flatten the energy response. As explained previously, these weighting factors $w_{comp}(n)$ can be obtained as follows: the input samples are replaced by a constant value set to the value of the corresponding up-sampling factor, for example to 5 in the case of up-sampling from 12 800 Hz to 64 000 Hz and assuming an FIR filter of gain equal to 1 (otherwise this constant must be divided by the gain of the FIR filter which is the sum of these coefficients). Next, the resampling is applied to this signal, the resampled signal is then used to normalize (divide) the resampled audio signal $s_{ech}(n)$ or, in an equivalent manner, its inverse is used as multiplicative compensation factors $w_{comp}(n)$. The compensation is in particular necessary when the impulse responses of resampling filters at the boundary between frames, and in case of internal frequency switching, do not ensure a "perfect reconstruction" and are temporally incoherent; when the resampling is done using a filter bank having (quasi-) perfect reconstruction properties (for example QMF or PQMF filter banks), it would be possible not to use such a compensation.

It will be understood from FIG. 7 that, in the general case, in the absence of compensation (step E306 of FIG. 3), the invention can cause energy modulations in case of internal coding/decoding frequency switching.

FIG. 5b illustrates the steps implemented to obtain the second sampled segment ($seg.2_{ech}$), in the case where the sampling frequency of the preceding frame is lower than the sampling frequency of the current frame.

Thus, for example, if $fs_1=fs_{old}=12.8$ kHz (and $fs_2=fs_{new}=16$ kHz), the signal of the preceding frame has a 0-6400 Hz frequency band, whereas the signal of the current frame has a 0-8000 Hz frequency band. To avoid band switching defects, a cross-fade is applied to the signal associated with the start of the current frame, that is to say, here, as described with reference to FIG. 3, to the second segment. The resampling to obtain the second resampled segment ($seg.2_{ech}$) in this case comprises the following steps:

In the step E501b, in this embodiment, the second segment is formed from the first $2L_{filt}^{new}=30$ samples of the current frame (syn) and from a memory of the past signal of length $2L_{filt}^{max}$ set to zero.

In the step E502b, a resampling with band limitation to 6.4 kHz (incorporated in the resampling FIR filter) from the frequency $fs_{new}=16$ kHz to the frequency $fs^{out}$ is implemented.

Following this resampling step, a resampled transition segment $seg.tr_{ech}$ is obtained.

Another resampling step is performed in E503b for the second segment as defined in E501b. If $fs_{new} \neq fs^{out}$, the resampling is performed from the frequency $fs_{new}$ to the frequency $fs^{out}$, to obtain an intermediate segment $seg._{int}$.

If $fs_{new}=fs^{out}=16$ kHz, then no resampling is necessary, but a shift of $L_{filt}^{new}=15$ samples is applied to the signal at the output of the post-filter (BPF) to find the intermediate segment $seg.int_{ech}$.

In the step E504b, the two segments, transition segment ($seg._{tr}$) and intermediate segment ($seg._{int}$) are combined to perform a cross-fade, as follows:

$$seg.2_{ech}(n) = fac(n)seg.int._{ech}(n) + (1 - fac(n))seg.tr_{ech}(n), n$$

$$= 0, \ldots, 2L_{over} - 1$$

in which $fac(n)=0, n=0, \ldots, L_{over}-1$ $fac(n)=(n-L_{over}+1)/L_{over}, n=L_{over}, \ldots, 2L_{over}-1$ and $L_{over}=fs^{out} \cdot L_{filt}^{old}/fs_{old}=15 fs^{out}/16$ In variants, weighting factors other than the example of linear weighting defined here will be able to be used. The cross-fade is done according to the preferred embodiment on the second half of the overlap zone. In this case, the calculation of the first half of the intermediate segment $seg.int_{ech}$ is not necessary (because it has a zero weight in the cross-fade). For reasons of symmetry in the preferred embodiment, the cross-fade is therefore done over $L_{over}$ samples. In the case where the sampling frequency of the preceding frame is lower than the sampling frequency of the current frame, there is the possibility of doing the cross-fade over a greater number of samples. In this case, this also prolongs the generation of a transition segment $seg._{tr}$.

In the embodiment described above, the resampling is performed by means of a polyphase FIR filtering with an associated delay (0.9375 ms) that is identical whatever the frequency $fs_1$ or $fs_2$. The FIR filtering here is $L_1=12$ samples at the frequency $fs_1$ and $L_2=15$ samples at the frequency $fs_2$.

In variants using a filter bank instead of the FIR filtering for the resampling, the cross-fade in relation to FIGS. 5a and 5b will be able to be replaced by a temporal weighting of appropriate sub bands of the transition segments, after decomposition into sub bands of at least the transition segments, in order to perform a progressive start up of certain sub bands to widen the acoustic band (by "fade-in" when $fs_{new}=fs_2>fs_{old}=$) or a progressive attenuation of certain sub bands to reduce the acoustic band (in "fade-out" when $fs_{new}=fs_1>fs_{old}=fs_2$).

In a second embodiment of the resampling method according to the invention, the resampling is done not directly by the use of a resampling filter by means of a polyphase FIR filtering but is broken down into an up-sampling to a common higher frequency for the two frames followed by a low-pass filtering and a down-sampling. This embodiment constitutes an alternative solution to the problem of audible artifacts which can occur upon a switchover of sampling frequency between two frames.

In the case which is of interest here, the preceding frame is sampled at a first frequency different from a second sampling frequency of the current frame. Thus, upon a switchover from the frequency $fs_1$ (frame N−1) to the frequency $fs_2$ (current frame N), the following steps are implemented:

In the preceding frame (N−1) at the frequency $fs_1$, up to the last $L_1=12$ samples, a conventional resampling by polyphase FIR from the frequency $fs_1$ to the frequency $fs^{out}$ is performed.

From the last $L_1$ samples (first predetermined number of samples) of the preceding frame to the first $L_2=15$ samples (second predetermined number of samples) of the current frame:

a. A non-uniform up-sampling is performed to reach a common intermediate resampling frequency.

For example if $fs^{out}=32$ kHz, $fs_1=12.8$ kHz and $fs_2=16$ kHz, 4 zeros are added after each sample of the last $2 \times L_1=24$ samples of the preceding frame, and 3 zeros are added after each sample of the first $2 \times L_2=30$ samples of the current frame. This up-sampling thus makes it possible to reach an intermediate frequency, here 64 mHz, which is common to the two segments associated with different frames.

b. An FIR filtering is applied to the sequence which is uniformly clocked at 64 kHz over $(5 \times 2 \times L_1 + 4 \times 2 \times L_2)$ samples. In this embodiment, and if $fs^{out}>\min(fs^{new}, fs^{old})$, the cutoff frequency of the FIR filter over the "left hand part" is different from the cutoff frequency of the filter over the "right hand part", which implies a switchover of the FIR filter to the same intermediate frequency. This does not pose any production difficulties because the state memory of an FIR filter is the past input signal, it is sufficient to simply change the coefficients of the filter. By contrast, an abrupt change from a filter with a cutoff frequency of 6.4 kHz to a filter with a cutoff frequency of 8 kHz would create an abrupt change of bandwidth and an objectionable audible artifact. It is perfectly possible to add intermediate filters, for example a filter with cutoff frequency at 7200 Hz to soften the transition. If $fs^{out}<=\min(fs^{new}, fs^{old})$, the cutoff frequency of the filter can remain constant, typically at $fs^{out}/2$.

c. A down-sampling step is then performed to reach the output frequency $fs^{out}$.

d. In a particular embodiment, a compensation (by temporal gain) is added to equalize the level of the signal resulting from the down-sampling step c. This compensation can be obtained by replacing the samples before up-sampling in the step b with the same value set at the value of the up-sampling factor, for example at 5 in the case of up-sampling from 12.8 kHz to 64 kHz and assuming an FIR filter of gain equal to 1, otherwise this constant must be divided by the gain of the FIR filter (which is the sum of these coefficients). Next, the FIR filtering of the step b at the intermediate frequency is applied to this sequence (of 0 and constants). The signal is then downsampled to the frequency $fs^{out}$. It is then used to normalize (divide) the signal or, in an equivalent manner, its inverse is used as multiplicative compensation factors $w_{comp}(n)$.

In the current frame (N), after the first $L_2$ samples, a conventional resampling by polyphase FIR filter from the frequency $fs_2$ to the frequency $fs^{out}$ is performed.

In the case described above, $fs_1$ is lower than $fs_2$. The principle described previously obviously applies to the reverse case of a switchover from a higher frequency $fs_1$ (frame N−1) to the frequency $fs_2$ (current frame N).

This second embodiment makes it possible, in the same way as in the first embodiment, to ensure a soft transition upon the switchover from one sampling frequency to another, from one frame to another. This second embodiment has the advantage of using only once a resampling filter on the up-sampled sequence of the samples of the preceding frame and of the current frame. By contrast, it entails involving a higher common intermediate frequency, which is not always possible depending on the desired sampling frequencies. Furthermore, according to the principle of polyphase filtering, the complexity of calculation of this second embodiment will be able to be reduced obviously by disregarding the multiplications with the input samples of null value and by calculating only the filtered samples which will be selected by the down-sampling. This polyphase optimization is not detailed because it is well known from the prior art and the resampling by phase switchover in AMR-WB or G.718 codecs gives an example of implementation, and the result is equivalent to the method described above.

As in the case of the first embodiment, the latter is applicable in a decoder as represented in FIG. 2. The resampling method is implemented by the resampling device 210.

Figure 8:
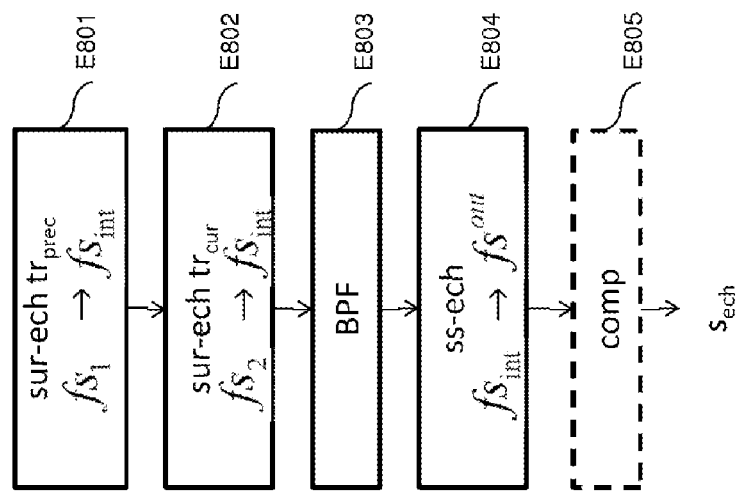
FIG. 8 illustrates, in flow diagram form, a resampling method according to a second embodiment of the invention.

The latter notably implements the following steps represented with reference to FIG. 8, for a current frame at a frequency $fs_2$ and a preceding frame at a frequency $fs_1$:

up-sampling (E801) to a common intermediate frequency $fs_{int}$) of a part of the samples of the preceding frame by addition of a first number of samples at zero;

up-sampling (E802) to the common intermediate frequency of a part of the samples of the current frame by addition of a second number of samples at zero;

application of a low-pass filtering (E803) to the up-sampled signal obtained from the up-sampling steps, the filtering if necessary comprising different cutoff frequencies over the up-sampled part of the preceding frame and that of the current frame;

down-sampling (E804) of the filtered signal to obtain an output sampling frequency.

As with the first embodiment, a weighting signal can be applied (E805) to the current frame resampled by the method described above, to compensate for the energy fluctuation which might have occurred in the various resampling steps.

In this embodiment, the combination of the signals obtained from the preceding frame and from the current frame is performed at the common resampling frequency before being filtered by the low-pass filter. This combination makes it possible to ensure a soft transition.

Figure 9:
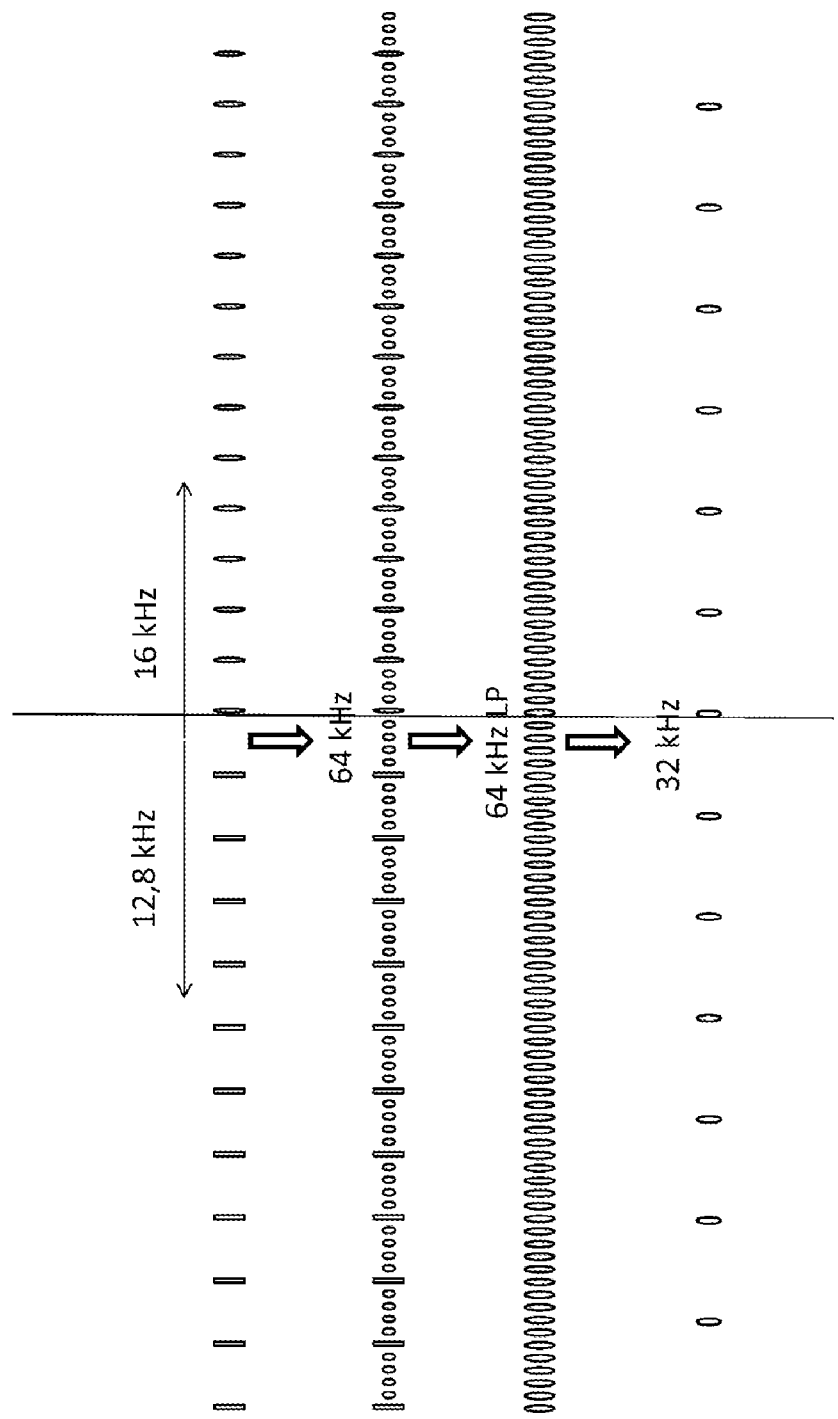
FIG. 9 illustrates an example of resampling according to the second embodiment of the invention.

FIG. 9 shows an example of this equivalent solution for the cases where the high frequency after up-sampling is common (in the example given in the figure, the resampling from 16 kHz to 8 kHz is done also by up-sampling to 64 kHz). The first line gives the temporary location of the samples, the squares symbolize the end of the preceding frame at 12.8 kHz, the ovals symbolize the samples at the start of the current frame 16 kHz. The second line shows this concatenated signal up-sampled to 64 kHz, by adding 4 zeros after each sample of the preceding frame (step E801 of FIG. 8) and 3 zeros after each sample of the current frame (step E802 of FIG. 8). This signal is then filtered by a low-pass filter (marked "64 kHz LP" in the figure) (step E803 of FIG. 8), then it is down-sampled (step E804 of FIG. 8) to 8 kHz by keeping only one sample in 8. Finally, this signal is, if necessary, weighted (step E805 of FIG. 8) to equalize the fluctuation of the energy around the boundary between the frames. It should be noted that, in this example, since $fs^{out}<=\min (fs^{new}, fs^{old})$ the cutoff frequency of the filter can remain constant, at 4000 Hz.

In variants of the invention, the post-filter (BPF) at the output of the CELP decoding is not used. The resampling memory is then obtained from the last samples of the preceding frame at the output of the CELP decoding instead of the last samples of the preceding frame at the output of the post-filter.

In variants of the invention, other decoders will be able to be used, for example variants of CELP decoding or of decoding according to models of BroadVoice™ or SILK type known from the prior art or even decoders of transform type.

In variants of the invention, other resampling methods are possible to the coder, in particular by using other FIR filters, IIR filters instead of the FIR filters, or even a filter bank of QMF type for example. The principle remains the same.

Figure 10:
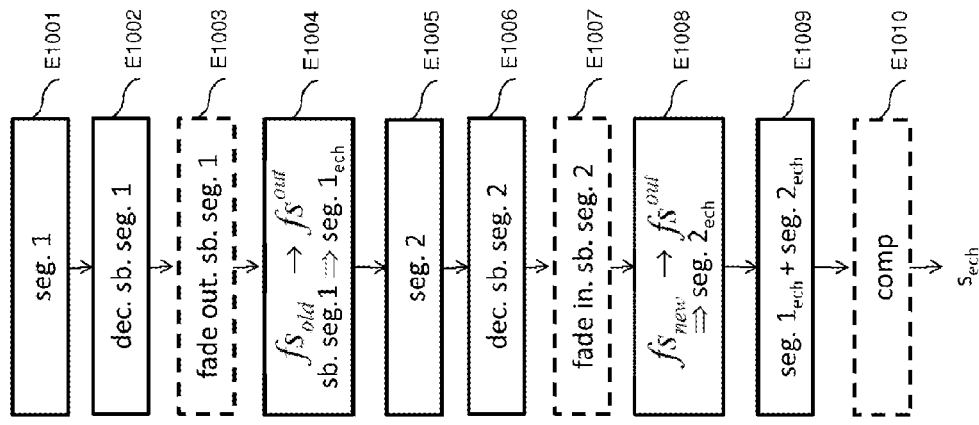
FIG. 10 illustrates, in flow diagram form, a variant of the invention, in the case of a resampling by filter bank.

FIG. 10 presents another alternative embodiment, in which the resampling by FIR filter is replaced by a bank of filters of FIR type causing a predetermined delay similar to the FIR filtering. An example of modulated filter banks is for example given in the G.729.1 codec for the band extension frequency envelope extraction and application part (denoted TDBWE for "Time Domain Bandwidth Extension"), but other implementations are possible.

The principle of the invention remains identical since in this case two temporal segments seg.1 are defined, one in the preceding frame CELP decoded (and possibly BPF post-filtered) at the frequency $fs_{old}$, the other, seg.2, in the current frame CELP decoded (and possibly BPF post-filtered) at the frequency $fs_{new}$. Zeros are added to the right of the segment seg.1 to complement it (in the "future"), and zeros are added at the left of the segment seg.2 to complement it (in the "past"). As in the case of the FIR filtering, these zeros can be added either directly by creating a concatenation buffer or indirectly by setting to zero the resampling memories in a separate buffer. The resampling by filter bank is applied to these segments separately by decomposition into sub bands (analysis) in E1002 and E1006 and synthesis by filter bank in E1004 and E1008. The two segments are then combined (added) on the overlapping part in E1009.

In a variant, this combination will be able to be performed in the sub band domain before synthesis. The main difference compared to the embodiment described in the case of an FIR filtering lies in the fact that there is no need to implement a cross-fade or to calculate a transition signal because the decomposition into sub bands, if it is fine enough in terms of number of sub bands, makes it possible to perform a soft transition by direct weighting of the appropriate sub bands before synthesis; the weighting is applied to the sub bands associated with the 6.4-8 kHz zone, either by attenuation in E1003 or by progressive augmentation in E1007. The same form of weighting as in FIG. 6b can be performed in E1003 and the temporally complementary "mirror" version can be used in E1007.

Finally, if the banks of filters used for the resampling are of modulated type, the associated impulse responses are generally coherent between frame and, in this case, the weighting in E1010 does not need to be used.

Thus, in this embodiment, in the case where the first sampling frequency is lower than the second sampling frequency, the obtaining of the second resampled segment comprises the following steps:

obtaining of a division into sub bands in at least the second segment;

application of a (increasing) weighting function to at least one sub band of the second segment;

obtaining of the second resampled segment by recombination of the sub bands comprising at least the one that is weighted.

Similarly, in the case where the first sampling frequency is higher than the second sampling frequency, the obtaining of the first resampled segment comprises the following steps;

obtaining of a division into sub bands in at least the first segment;

application of a (decreasing) weighting function to at least one sub band of the first segment;

obtaining of the first resampled segment by recombination of the sub bands comprising at least the one that is weighted.

Figure 11:
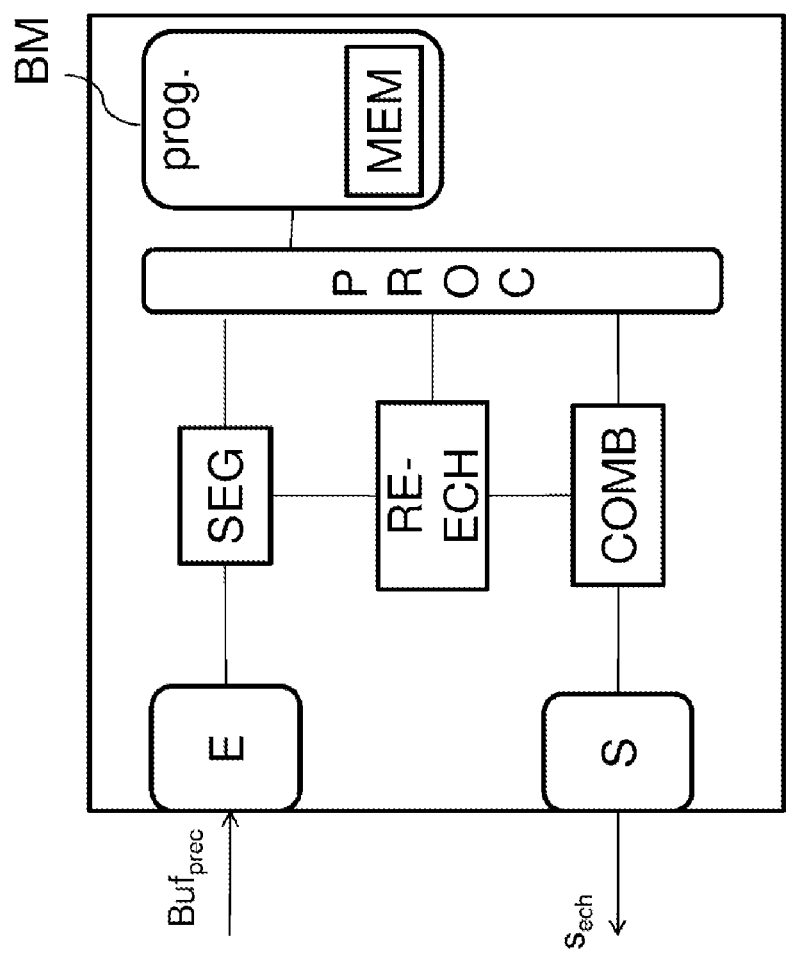
FIG. 11 illustrates a hardware representation of a resampling device according to an embodiment of the invention.

FIG. 11 represents an example of hardware embodiment of a resampling device 700 according to the invention. The latter can form an integral part of an audio frequency signal coder, decoder or of an equipment item receiving audio frequency signals.

This type of device comprises a processor PROC cooperating with a memory block BM comprising a storage and/or working memory MEM.

Such a device comprises an input module E capable of receiving audio signal frames and notably a stored part ($Buf_{prec}$) of a preceding frame at a first sampling frequency $fs_1$.

It comprises an output module S capable of transmitting a current audio frequency signal frame resampled to the output sampling frequency $fs^{out}$.

The processor PROC controls the signal segment determination module SEG, capable of determining a first signal segment by addition of a first predetermined number of samples at zero at the end of stored samples of the preceding frame and a second signal segment by addition of a second predetermined number of samples at zero at the start of samples of the current frame.

The processor also controls a resampling module RE-ECH capable of applying to the first segment at least one resampling filter resampling from the first frequency to the output frequency and of applying to the second segment at least one resampling filter resampling from the second frequency to the output frequency.

It also controls a combination module COMB capable of combining the overlapping part of the first and second resampled segments to obtain the resampled current frame.

The memory block can advantageously comprise a computer program comprising code instructions for the implementation of the steps of the resampling method within the meaning of the invention, when these instructions are executed by the processor PROC, and notably the steps of determination of a first signal segment by addition of a first predetermined number of samples at zero at the end of stored samples of the preceding frame, obtaining of the first resampled segment by application to the first segment of at least one resampling filter resampling from the first frequency to the output frequency, determining a second signal segment by addition of a second predetermined number of samples at zero at the start of samples of the current frame, obtaining of the second resampled segment by application to the second segment of at least one resampling filter resampling from the second frequency to the output frequency and combination of the overlapping part of the first and second resampled segments to obtain at least a part of the resampled current frame.

Typically, the description of FIG. 3 uses the steps of an algorithm of such a computer program. The computer program can also be stored on a memory medium that can be read by a reader of the device or that can be downloaded into the memory space thereof.

Generally, the memory MEM stores all the data necessary to the implementation of the method.

An exemplary embodiment of the present disclosure improves the prior art situation.

Although the present disclosure has been described with reference to one or more examples, workers skilled in the art will recognize that changes may be made in form and detail without departing from the scope of the disclosure and/or the appended claims.

The invention claimed is:

1. A method for resampling of an audio frequency signal at an output sampling frequency, wherein the method comprises the following acts performed by a processing device of an audio coder or decoder:

receiving a current frame of an audio frequency signal sampled at a second sampling frequency and a stored part of a preceding frame sampled at a first sampling frequency different from the second sampling frequency, and wherein resampling comprises:

determining a first signal segment by addition of a first predetermined number of samples set at zero at the end of stored samples of the preceding frame;

obtaining a first resampled segment by application to the first segment of at least one resampling filter resampling from the first sampling frequency to the output sampling frequency;

determining a second signal segment by addition of a second predetermined number of samples set at zero at the start of samples of the current frame;

obtaining a second resampled segment by application to the second segment of at least one resampling filter resampling from the second sampling frequency to the output sampling frequency;

combining an overlapping part of the first and second resampled segments to obtain at least a part of the current resampled frame; and transmitting the current resampled frame, which has been resampled at the output sampling frequency.

2. The method as claimed in claim 1, wherein, in the case where the first sampling frequency is lower than the second sampling frequency, the obtaining of the second resampled segment comprises:

obtaining a transition segment by resampling from the second frequency to the output sampling frequency, of the second segment, over a limited frequency band;

obtaining a second intermediate resampled segment by resampling from the second sampling frequency to the output sampling frequency, of the second segment;

applying a cross-fading function to at least a part of the transition and intermediate segments.

3. The method as claimed in claim 1, wherein, in the case where the first sampling frequency is lower than the second sampling frequency, the obtaining the second resampled segment comprises:

obtaining a sub-band division in at least the second segment;

applying a weighting function to at least one sub-band of the second segment;

obtaining the second resampled segment by recombination of the sub-bands comprising at least the one that is weighted.

4. The method as claimed in claim 1, wherein, in the case where the first sampling frequency is higher than the second sampling frequency, the obtaining the first resampled segment comprises:

obtaining a transition segment by resampling from the first sampling frequency to the output sampling frequency, of the first segment, over a limited frequency band;

obtaining a first intermediate resampled segment by resampling from the first sampling frequency to the output sampling frequency, of the first segment;

applying a cross-fading function to at least a part of the transition and intermediate segments.

5. The method as claimed in claim 1, wherein the method further comprises multiplying the current resampled frame resulting from the combination, by a weighting signal.

6. The method according to claim 1, further comprising:

decoding the current signal frame of the audio frequency signal, comprising selecting a decoding sampling frequency, wherein, in the case where the preceding frame is sampled at the first sampling frequency different from the second sampling frequency of the current frame, the method comprises performing the resampling.

7. An audio coder or decoder device for resampling an audio frequency signal at an output sampling frequency, wherein the device comprises:

an input and an output;
a processor; and
a non-transitory computer-readable medium comprising instructions that, when executed by the processor configure the device to perform acts comprising:

receiving on the input a current frame of an audio frequency signal sampled at a second sampling frequency and a stored part of a preceding frame sampled at a first sampling frequency different from the second sampling frequency;

determining a first signal segment by addition of a first predetermined number of samples at zero at the end of stored samples of the preceding frame;

obtaining a first resampled segment by application to the first segment of at least one resampling filter resampling from the first sampling frequency to the output sampling frequency;

determining a second signal segment by addition of a second predetermined number of samples set at zero at the start of samples of the current frame;

obtaining a second resampled segment by application to the second segment of at least one resampling filter resampling from the second sampling frequency to the output sampling frequency;

combining the overlapping part of the first and second resampled segments to obtain at least a part of the current resampled frame transmitting on the output the current resampled frame, which has been resampled at the output sampling frequency.

8. The device of claim 7, further comprising an audio frequency signal decoder, which comprises a module that selects a decoding sampling frequency.

9. A non-transitory processor-readable storage medium, on which is stored a computer program comprising code instructions for executing a resampling method for resampling of an audio frequency signal at an output sampling frequency, when the instructions are executed by a processor of a processing device of an audio coder or decoder, the instructions comprises:

instructions that configure the processing device to receive a current frame of an audio frequency signal sampled at a second sampling frequency and a stored part of a preceding frame sampled at a first sampling frequency different from the second sampling frequency;

instructions that configure the processing device to determine a first signal segment by addition of a first predetermined number of samples set at zero at the end of stored samples of the preceding frame;

instructions that configure the processing device to obtain a first resampled segment by application to the first segment of at least one resampling filter resampling from the first sampling frequency to the output sampling frequency;

instructions that configure the processing device to determine a second signal segment by addition of a second predetermined number of samples set at zero at the start of samples of the current frame;

instructions that configure the processing device to obtain a second resampled segment by application to the second segment of at least one resampling filter resampling from the second sampling frequency to the output sampling frequency;

instructions that configure the processing device to combine an overlapping part of the first and second resampled segments to obtain at least a part of the current resampled frame; and instructions that configure the processing device to transmit the current resampled frame which has been resampled at the output sampling frequency.

* * * * *